US008657310B2

(12) United States Patent　　　(10) Patent No.:　　US 8,657,310 B2
Pan　　　　　　　　　　　　　　　(45) Date of Patent:　　Feb. 25, 2014

(54) WAFER BOX CONVEYOR

(75) Inventor: Yung-Chin Pan, New Taipei (TW)

(73) Assignee: Gudeng Precision Industrial Co., Ltd., New Taipei (TW)

( * ) Notice: Subject to any disclaimer, the term of this patent is extended or adjusted under 35 U.S.C. 154(b) by 43 days.

(21) Appl. No.: 13/488,757

(22) Filed: Jun. 5, 2012

(65) Prior Publication Data

US 2013/0257001 A1　　Oct. 3, 2013

(30) Foreign Application Priority Data

Apr. 2, 2012　(TW) .............................. 101205978 A

(51) Int. Cl.
　　B62B 3/10　　(2006.01)
(52) U.S. Cl.
　　USPC ...................................... 280/47.35; 414/541
(58) Field of Classification Search
　　USPC .............. 280/79.3, 79.4, 79.11, 47.34, 47.35,
　　　　　　280/47.41, 47.371, 651; 414/809, 663, 539,
　　　　　　414/541, 344, 479, 659, 660, 661, 940;
　　　　　　　　　　　　　　　　　　　　　211/126.1
See application file for complete search history.

(56) References Cited

U.S. PATENT DOCUMENTS

| 1,891,393 | A | * | 12/1932 | Oppenlander | 108/189 |
|---|---|---|---|---|---|
| 2,253,824 | A | * | 8/1941 | Townsend et al. | 16/35 R |
| 3,111,333 | A | * | 11/1963 | Marini et al. | 280/47.19 |
| 3,199,683 | A | * | 8/1965 | Graswich | 211/41.1 |
| 3,292,795 | A | * | 12/1966 | Chappell | 211/85.19 |
| 3,399,903 | A | * | 9/1968 | Bailey | 280/47.34 |
| 3,749,414 | A | * | 7/1973 | Lynn | 280/47.19 |
| 3,945,660 | A | * | 3/1976 | Zalewski | 280/42 |
| 4,876,785 | A | * | 10/1989 | Driggers | 29/426.3 |
| 5,217,343 | A | * | 6/1993 | Bostad et al. | 414/667 |
| 5,294,009 | A | * | 3/1994 | Maurer et al. | 211/126.15 |
| 5,375,962 | A | * | 12/1994 | Kempf | 414/541 |
| 5,525,025 | A | * | 6/1996 | Ootmar Ten Cate et al. | 414/529 |
| 5,595,470 | A | * | 1/1997 | Berkey et al. | 414/495 |
| D409,811 | S | * | 5/1999 | Hutchinson | D34/21 |
| 5,967,740 | A | * | 10/1999 | Pflueger et al. | 414/749.6 |
| 6,033,175 | A | * | 3/2000 | Pflueger et al. | 414/401 |
| 6,102,647 | A | * | 8/2000 | Yap | 414/539 |
| 6,205,881 | B1 | * | 3/2001 | Gravell et al. | 74/483 R |
| 6,247,601 | B1 | * | 6/2001 | Norton et al. | 211/41.14 |
| 6,364,331 | B1 | * | 4/2002 | Yap | 280/47.371 |
| 6,454,512 | B1 | * | 9/2002 | Weiss | 414/663 |
| 6,547,473 | B2 | * | 4/2003 | Takayama et al. | 403/25 |
| 6,551,049 | B2 | * | 4/2003 | Gravell et al. | 414/539 |
| 6,592,318 | B2 | * | 7/2003 | Aggarwal | 414/217.1 |
| 6,592,322 | B2 | * | 7/2003 | Yang et al. | 414/663 |
| 6,663,139 | B1 | * | 12/2003 | Smith | 280/651 |
| 6,736,279 | B2 | * | 5/2004 | Allen | 211/189 |
| D546,019 | S | * | 7/2007 | James | D34/21 |

(Continued)

*Primary Examiner* — Katy M Ebner
*Assistant Examiner* — Brodie Follman
(74) *Attorney, Agent, or Firm* — Chun-Ming Shih; HDLS IPR Services

(57) ABSTRACT

The wafer box conveyer includes a chassis, a transverse moving mechanism, a longitudinal moving mechanism, a loading mechanism and a shock reduction mechanism. The chassis includes a frame and a plurality of wheels mounted under the frame. The transverse moving mechanism is movably connected to the frame. The longitudinal moving mechanism is movably connected to the transverse moving mechanism. A moving direction of the longitudinal moving mechanism is perpendicular to that of the transverse moving mechanism. The loading mechanism includes at least one tray for a wafer box. The shock reduction mechanism is disposed between the at least one tray and the frame for absorbing a load of the tray.

13 Claims, 7 Drawing Sheets

(56) References Cited

U.S. PATENT DOCUMENTS

| | | | |
|---|---|---|---|
| 7,360,785 B2* | 4/2008 | Smith | 280/659 |
| 7,419,063 B1* | 9/2008 | Hall | 211/133.1 |
| 7,857,329 B2* | 12/2010 | Cai | 280/47.35 |
| 2001/0048871 A1* | 12/2001 | Sasaki et al. | 414/539 |
| 2002/0021934 A1* | 2/2002 | Takayama et al. | 403/25 |
| 2003/0012626 A1* | 1/2003 | Aggarwal | 414/217.1 |
| 2003/0049115 A1* | 3/2003 | Yang et al. | 414/663 |
| 2003/0059289 A1* | 3/2003 | Yap | 414/541 |
| 2003/0077161 A1* | 4/2003 | Weiss et al. | 414/663 |
| 2003/0121874 A1* | 7/2003 | Koester et al. | 211/187 |
| 2004/0188017 A1* | 9/2004 | Davis et al. | 156/344 |
| 2004/0256818 A1* | 12/2004 | Amsili | 280/47.29 |
| 2005/0067360 A1* | 3/2005 | Darvial | 211/41.14 |
| 2005/0191159 A1* | 9/2005 | Benko | 414/490 |
| 2008/0093827 A1* | 4/2008 | Silberberg | 280/651 |
| 2009/0212536 A1* | 8/2009 | Tadeo | 280/655 |
| 2010/0116950 A1* | 5/2010 | Tallent et al. | 248/130 |
| 2010/0276910 A1* | 11/2010 | Wise | 280/651 |
| 2011/0068562 A1* | 3/2011 | Keffeler et al. | 280/651 |
| 2013/0121802 A1* | 5/2013 | Albrecht et al. | 414/809 |

* cited by examiner

WAFER BOX CONVEYOR

BACKGROUND OF THE INVENTION

1. Technical Field

The present invention relates to conveyers, particularly to wafer box conveyers.

2. Related Art

Usually, wafer fabs use wafer boxes to accommodate wafers and convey those wafer boxes between storage chests and wafer box loaders by conveying carts. However, human-operated conveying carts are uneconomical because they are easy to cause damage to wafers and operators, especially when wafers are larger and larger in size.

A conventional wafer box conveyer includes a frame, a horizontal moving unit, a vertical moving unit, at least one tray and an interlock mechanism. The frame has a horizontal cage with wheels. The horizontal moving unit includes a horizontal rail on the horizontal cage, a horizontal sliding block on the horizontal rail and a first shaft on the horizontal sliding block. The vertical moving unit has a vertical rail disposed on the horizontal sliding, a vertical sliding block on the vertical rail, and a second shaft on the horizontal sliding block.

However, such a conveyer tends to cause damage to the wafers thereon because of vibrations resulting from an uneven floor.

SUMMARY OF THE INVENTION

An objection of the present invention is to provide a wafer box conveyer which is provided with shock reduction mechanism so as to protect the conveyed wafers during conveyance and reduce the rate of damage.

To accomplish the above object, the wafer box conveyer of the present invention includes a chassis, a transverse moving mechanism, a longitudinal moving mechanism, a loading mechanism and a shock reduction mechanism. The chassis includes a frame and a plurality of wheels mounted under the frame. The transverse moving mechanism is movably connected to the frame. The longitudinal moving mechanism is movably connected to the transverse moving mechanism. A moving direction of the longitudinal moving mechanism is perpendicular to that of the transverse moving mechanism. The loading mechanism includes at least one tray for a wafer box. The shock reduction mechanism is disposed between the at least one tray and the frame for absorbing a load of the tray.

The present invention possesses following advantages. With the positioning mechanism fixed to a front side of the frame, the stability can be kept when the positioning mechanism is connected to the storage chest. By the arrangement of the elevator, the wafer box conveyer can be operated in manual mode or pneumatic mode for conveying the wafer boxes.

DETAILED DESCRIPTION OF THE INVENTION

Figure 1:
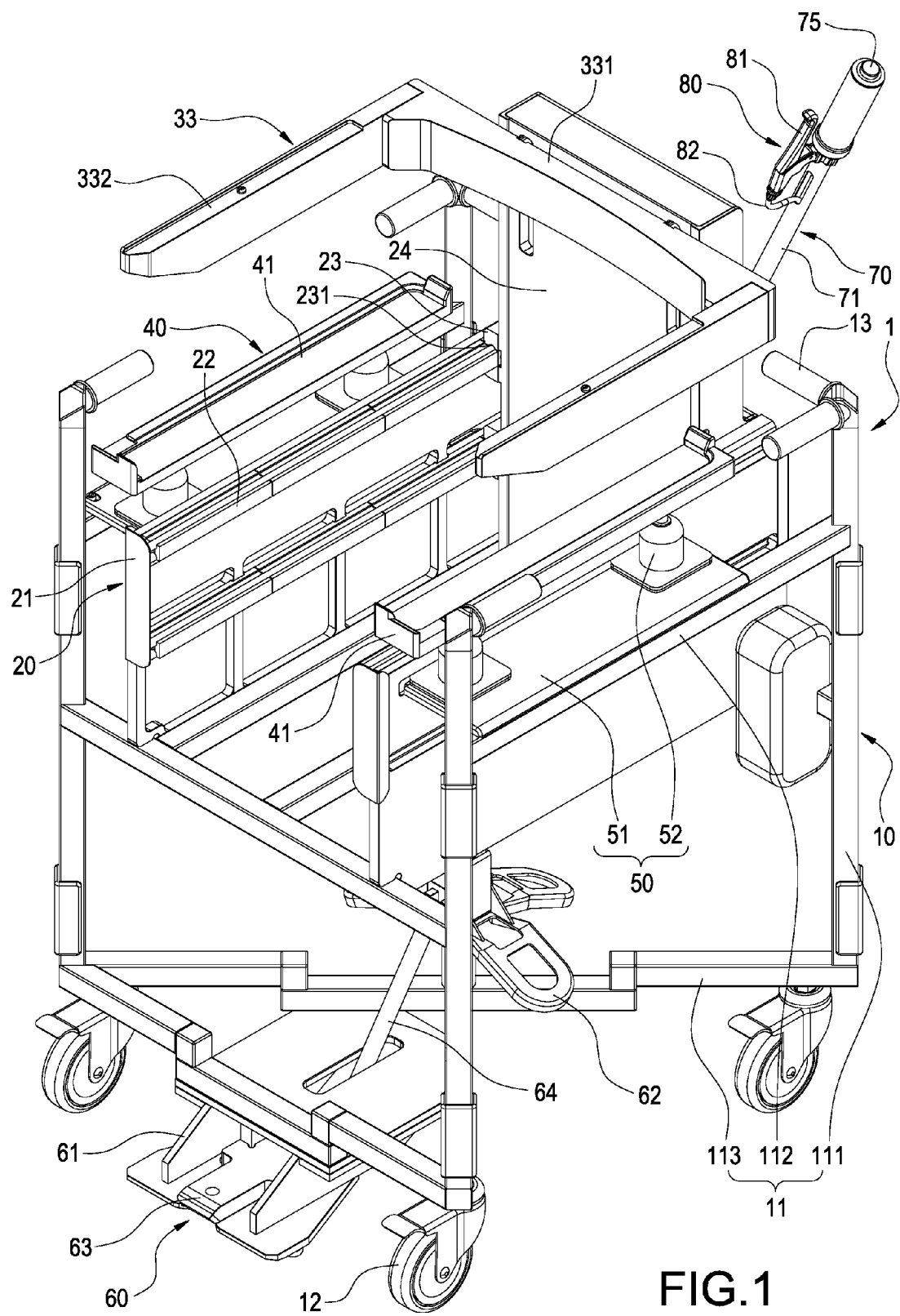
FIG. 1 is a perspective view of the present invention.
Figure 2:
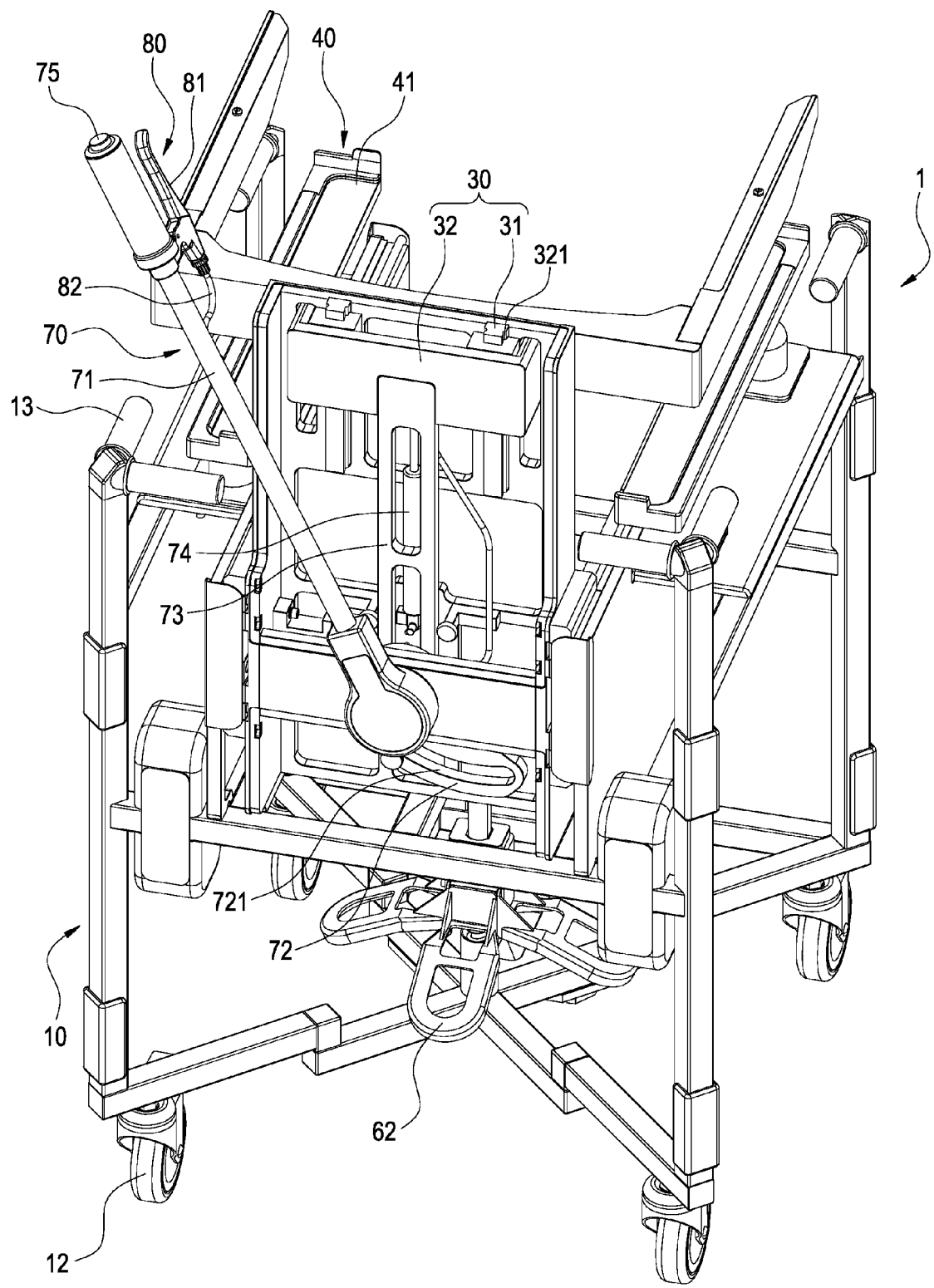
FIG. 2 is another perspective view of the present invention.

Please refer to FIGS. 1 and 2. The wafer box conveyer 1 of the present invention includes a chassis 10, a transverse moving mechanism 20, a longitudinal moving mechanism 30, a loading mechanism 40 and a shock reduction mechanism 50.

The chassis 10 includes at least one post, at least one horizontal rod, and at least one crossed rod. In this embodiment, they are four posts 111, five horizontal rods 112 and two crossed rods 113, respectively. The four posts 111 are settled at four corners. Each of the five horizontal rods 112 is connected between every two adjacent posts 111 and each of the crossed rods 113 is crosswise connected between the bottoms of two opposite posts 111. Every bottom ends of the four posts 111 adjacent to the crossed rods are connected with one wheel 12 and top ends of each the posts 111 are provided with at least one set of grips 13. Each set of grips 13 is on the different side of the frame 11. The frame 111 can be pushed toward three directions.

The transverse moving mechanism 20 is movably connected to the frame 11 and includes a pair of vertical plates 21, two pairs of first rails 22, two pairs of first guiding seats 23 and a moving seat 24. The vertical plates 21 are fixed to the front and rear horizontal rods 112 and above the crossed rods 113. The first rails 22 and the first guiding seats 23 can also be provided with one pair of each. Each pair of the first rails 22 is fixed on the internal surface of both vertical plates 21 and parallel to each other. Each of the first guiding seats 23 has a guiding trough 231 which is slidably connected to the at least one pair of first rail 22. The moving seat 24 is a substantial cuboid and connects to the at least one pair of first guiding seats 23 so as to horizontally slide on the frame 11.

The longitudinal moving mechanism 30 is movably connected to the transverse moving mechanism 20 and includes a pair of second rails 31, a second guiding seat 32 and an arm assembly 33. The second rails 31 are fixed to the back of the moving seat 24. The second guiding seat 32 is formed with a pair of sliding troughs 321 for slidably connecting to the second rails 31. The moving direction of the second guiding seat 32 is perpendicular to that of the moving seat 24. That is, the second moving seat 32 can be vertically moved on the moving seat 24. The arm assembly 33 is of a U shape and includes a connecting rod 331 and a pair of arms 332 separately mounted at two ends of the connecting rod 331. The connecting rod 331 is fixed at the front end of the second guiding seat 32 and follows the second guiding seat 32 to move vertically.

The loading mechanism 40 includes one or a pair of trays 41. The at least one tray 41 is separately located on the internal positions of the two arms 332. The at least one tray 41 is mounted on the frame 10 through the shock reduction mechanism 50 including at least one supporting plate 51 and shock absorbers 52. The supporting plate 51 is in a pair, corresponding to a pair of trays 41. The supporting plates 51 are disposed between the horizontal rods 112 and vertical plates 21. The shock absorbers 52 are fixed on the supporting plates 51 and correspond to the trays 41 for absorbing the load of the trays 41.

The present invention further includes a positioning mechanism 60 mounted on the chassis 10. The positioning mechanism 60 includes a base 61, a pedal operator 62, a clipping block 63 and a link 64. The base 61 is fixed to the front horizontal rod 112. The pedal operator 62 is disposed above the crossed rods 113 for automatic restoration after the pedal operator 62 was pressed down by foot. The clipping block 63 is in the internal part of the base 61 and connects the pedal operator 62 through the link 64. When the pedal operator 62 is pressed down by foot, the link 64 and clipping block 63 move downward to release the base 61 from a storage chest connected thereto.

The present invention further includes an elevator 70. Please refer to FIG. 5. The elevator 70 includes a rotating rod 71, a cam 72, a passive element 73, a pneumatic cylinder 74 and a controller 75. The rotating rod 71 is pivotally connected on the rear of moving seat 24. The cam 72 is connected to the rotating rod 71 so as to turn with the rotating rod 71. The cam 72 is formed with an arcked trough 721. Two ends of the passive element 73 are fixed to the second guiding seat 32 and a protrusion 731, respectively. The protrusion 731 is inserted in and confined to the arcked trough 721. One end of the pneumatic cylinder 74 is fixed to the moving seat 24 and the other end is connected to the second guiding seat 32. The controller 75 is mounted on the rotating rod 71 for controlling the pneumatic cylinder 74.

The present invention further includes a locking mechanism 80. Please refer to FIG. 5. The locking mechanism 80 includes a stem 81, a cord 82 and a stopper 83. The stem 81 is fixed to the rotating rod 71. The cord 82 connects the stem 81 and stopper 83. The stopper 83 is equipped corresponding to the at least one pair of the first rails 22 for limiting the forward and backward movement of the moving seat 24 to the extreme.

Figure 3:
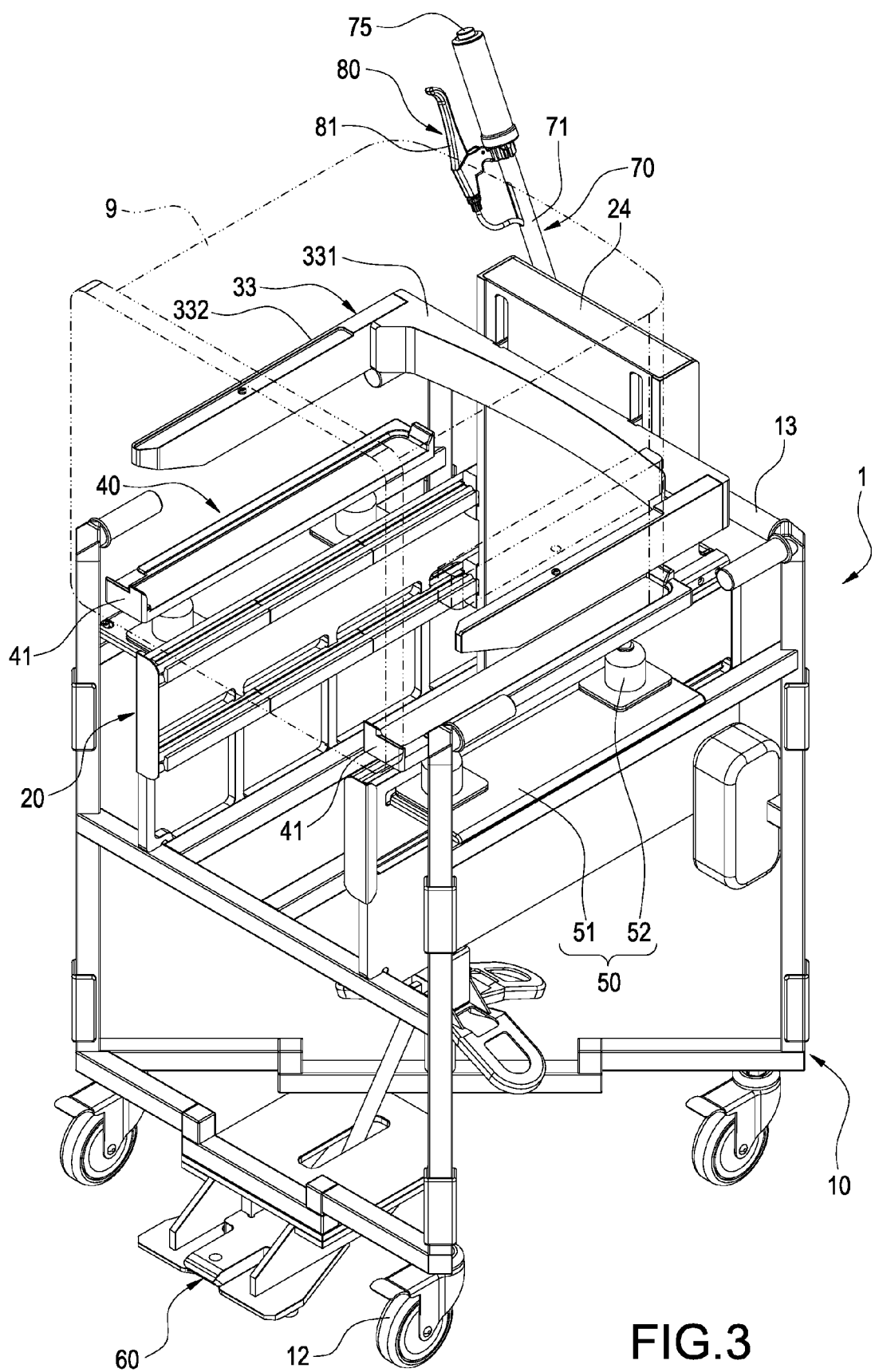
FIG. 3 is a schematic view of the present invention.
Figure 4:
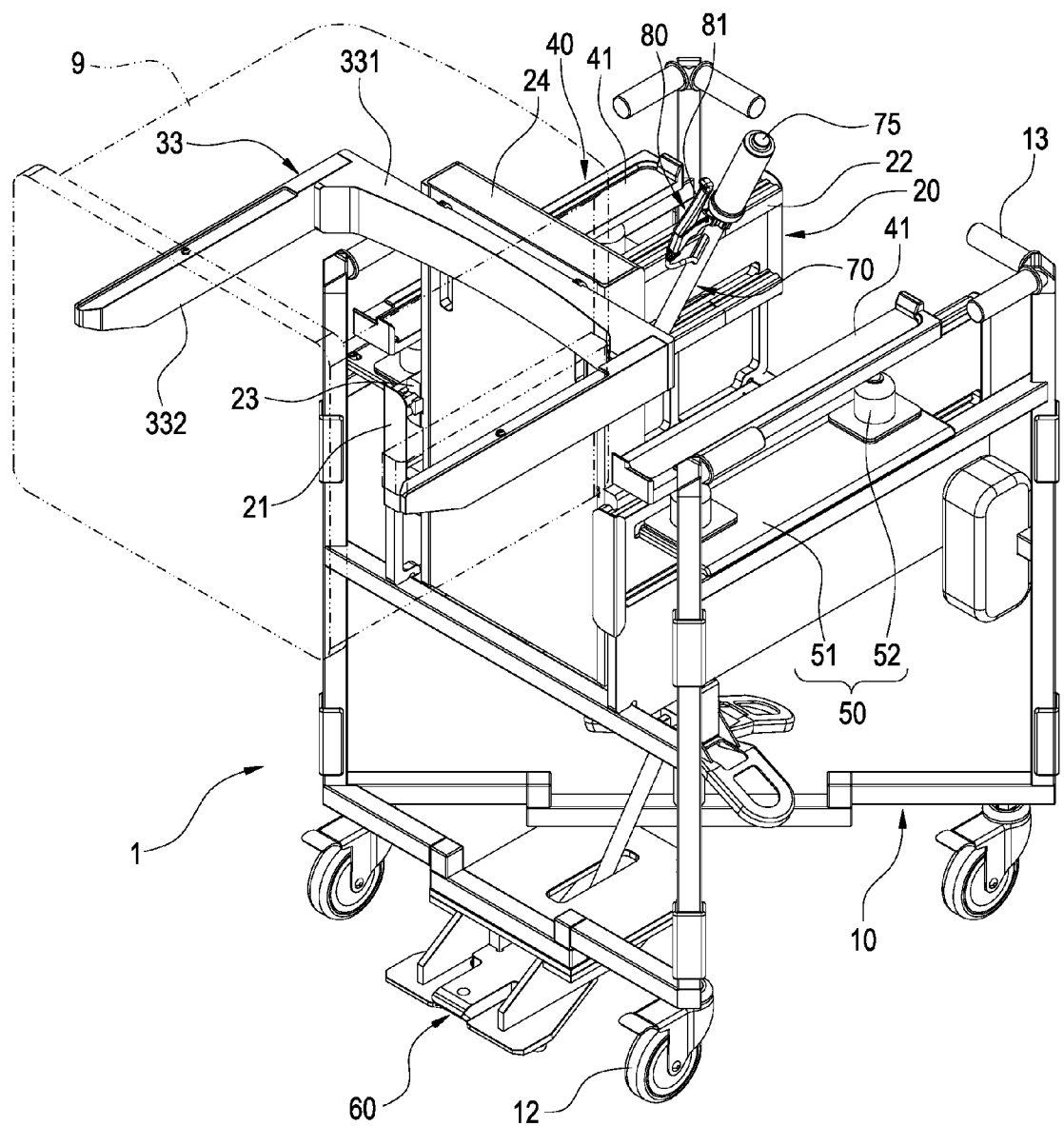
FIG. 4 is a schematic view of the present invention in use.

Please refer to FIG. 3. The present invention can be used to convey a wafer box 9. Wafers (not shown) can be piled up and then arranged into the wafer box 9. The wafer box 9 is inserted by the arms 332 and placed on the trays 41. Because the trays 41 are supported by the shock absorbers 52 of the shock reduction mechanism 50 and then connected to frame 11, wafers in the wafer box 9 will not be damaged by vibration when conveying on an uneven floor.

Please refer to FIGS. 4-7. When the wafer box conveyer 1 is pushed to a storage chest or workstation, the base 61 is inserted in the corresponding storage chest, and the clipping block 63 is moved by the link 64 and pedal operator 62 to clip the storage chest.

Figure 5:
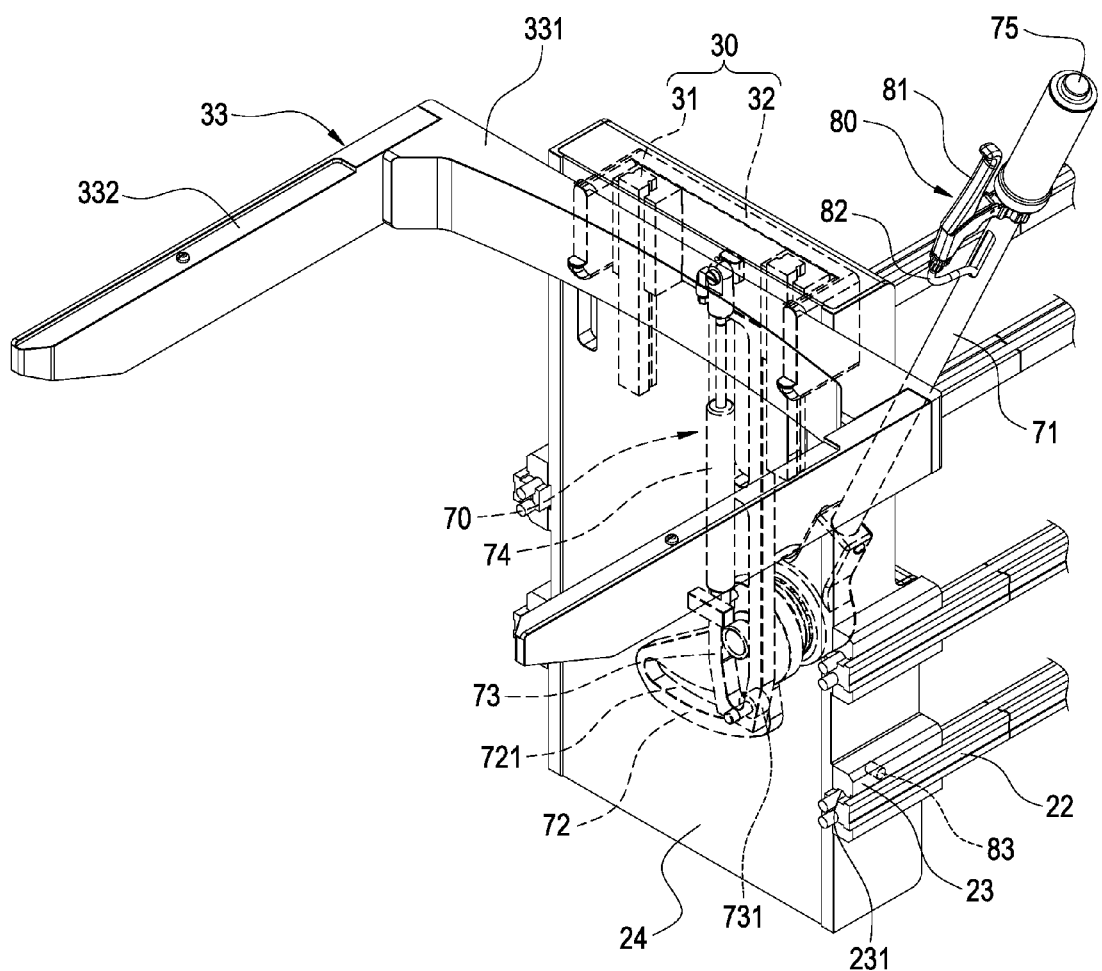
FIG. 5 is a fragmentarily enlarged view of FIG. 4.
Figure 6:
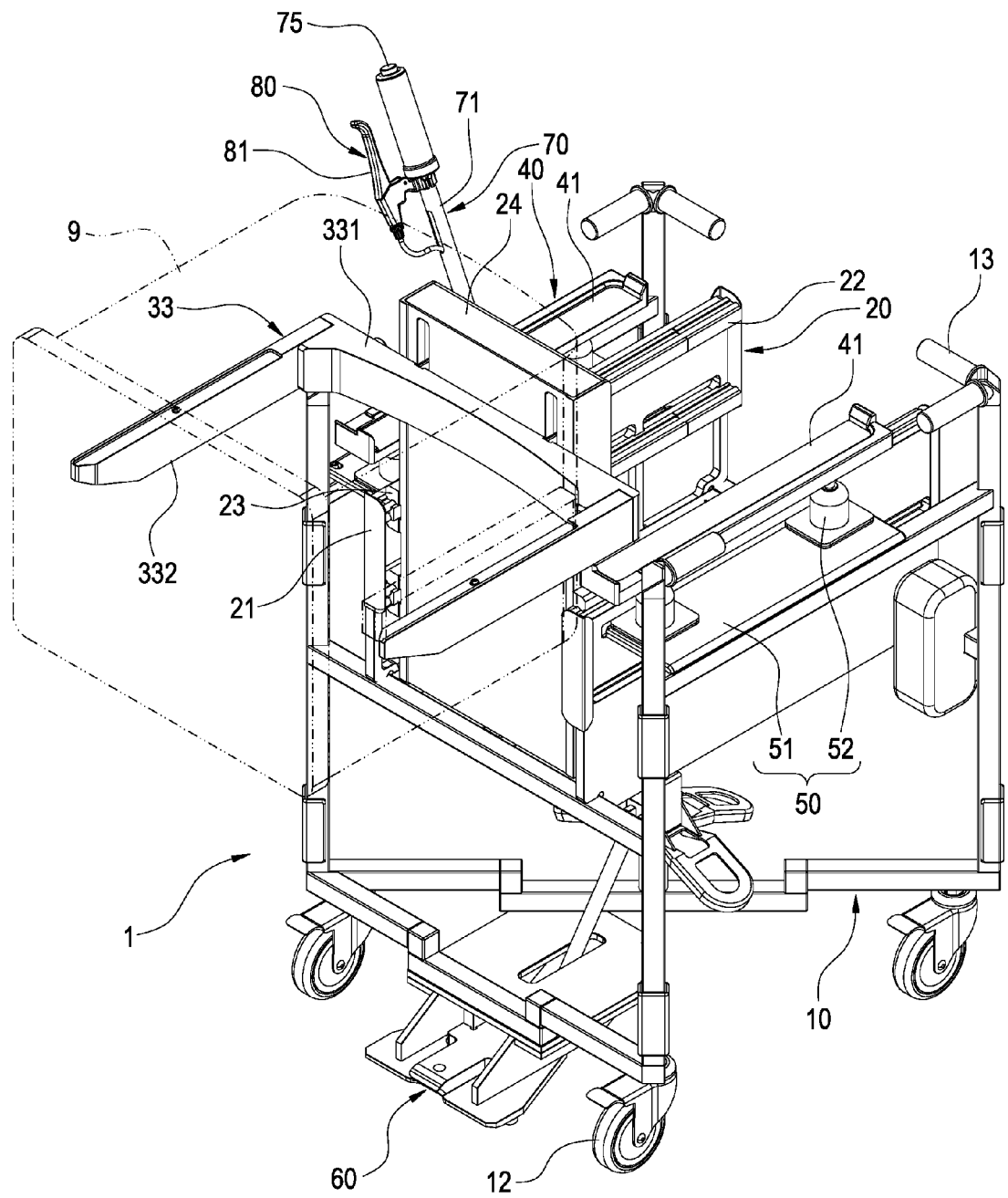
FIG. 6 is another schematic view of the present invention in use.
Figure 7:
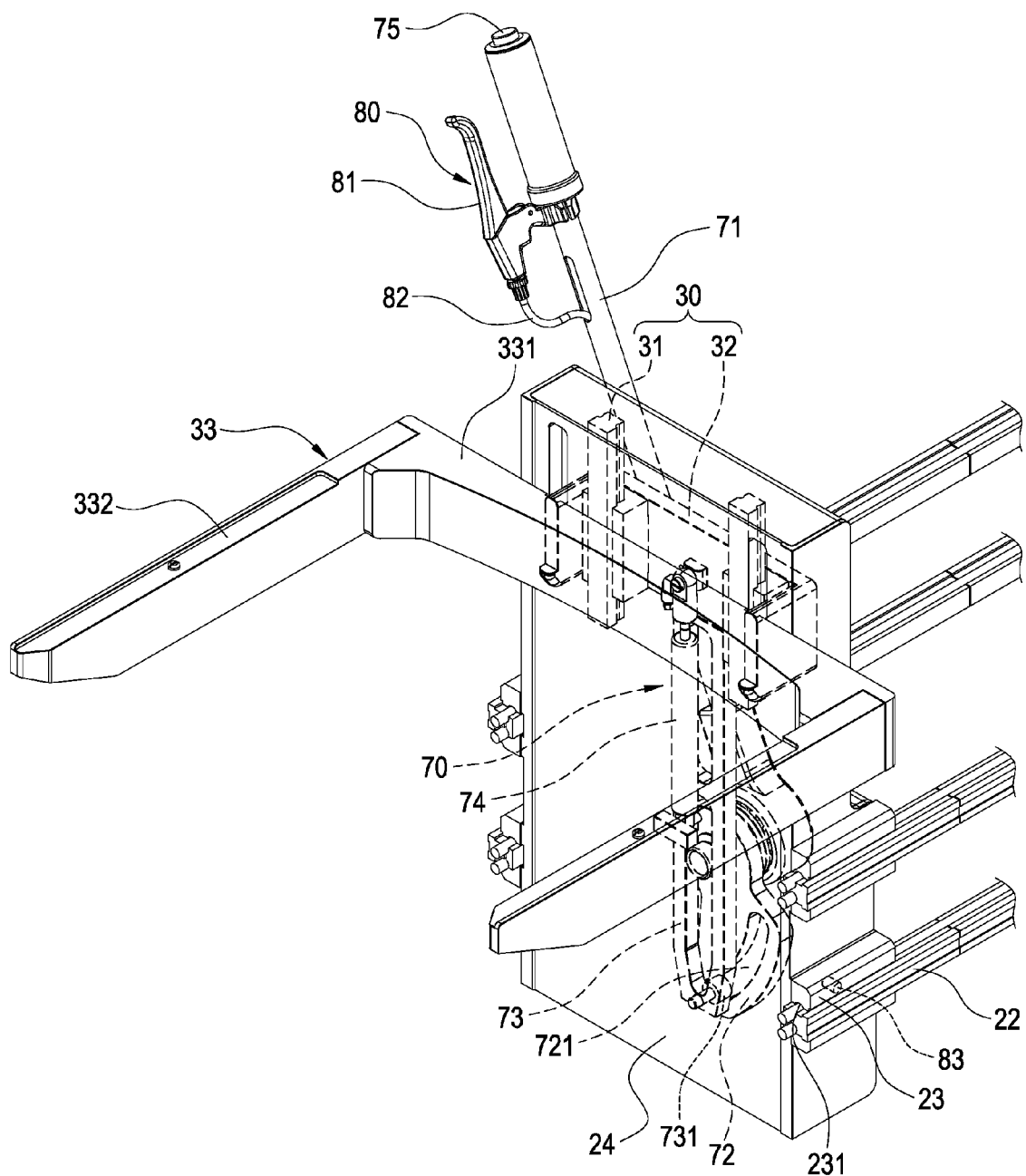
FIG. 7 is a fragmentarily enlarged view of FIG. 6.

The elevator 70 has a manual mode and a pneumatic mode. Please refer to FIG. 5 and FIG. 7, in the manual mode, when the rotating rod 71 is turned left to the limitresulting in the cam 72 turned with it, the protrusion 731 of the passive element 73 limited by the arcked trough 721 moves downwards. The longitudinal moving mechanism 30 is just at the lowest position as shown in FIG. 7. Contrarily, when the rotating rod 71 is turned right to limit resulting in the cam 72 turned with it, the protrusion 731 of the passive element 73 limited by the arcked trough 721 moves upwards. The longitudinal moving mechanism 30 is just at the highest position as shown in FIG. 5. The manual mode can make the upward and downward movement fast, which saves time. No matter where the longitudinal moving mechanism 30 is, in its highest position, lowest position or any other positions, the pneumatic mode can be chosen. In the pneumatic mode, when the controller 75 is pressed, the pneumatic cylinder 74 drives the longitudinal moving mechanism 30 to move upward or downward. The upward and downward movement in the pneumatic mode remains a slow movement. Consequently, wafers in the wafer box 9 can be protected properly. Moreover, it is not necessary to adopt the manual mode and the pneumatic mode simultaneously. Either manual mode or pneumatic mode can be adopted separately. The aforementioned description herein is not intended to be limiting the scope of the invention.

After the above operations, a user can press the pedal operator 62 down to move the link 64 and clipping block 63 downwards so as to release the base 61 from the storage chest.

While the forgoing is directed to a preferred embodiment of the present invention, other and further embodiments of the present invention may be devised without departing from the basic scope thereof. As such, the appropriate scope of the invention is to be determined according to the claims.

What is claimed is:

1. A wafer box conveyer comprising:
    a chassis comprising a frame and a plurality of wheels mounted under the frame;
    a first moving mechanism, movably connected to the frame;
    a second moving mechanism, movably connected to the first moving mechanism, wherein a moving direction of the second moving mechanism is perpendicular to that of the first moving mechanism;
    a loading mechanism comprising at least one tray for a wafer box;
    a positioning mechanism comprising a base, a pedal operator, a clipping block and a link, wherein the base is fixed to a front side of the frame, and the clipping block is disposed in the base and connects the pedal operator through the link; and
    a shock reduction mechanism disposed between the at least one tray and the frame for absorbing a load of the tray.

2. The wafer box conveyer of claim 1, wherein the frame comprises a plurality of posts, a plurality of horizontal rods and a plurality of crossed rods, each of the horizontal rods is connected between every two adjacent posts, and each of the crossed rods is crosswise located between two opposite posts.

3. The wafer box conveyer of claim 2, wherein the wheels are separately mounted on ends of the posts.

4. The wafer box conveyer of claim 3, wherein each of the posts is provided with one set of grips.

5. The wafer box conveyer of claim 1, wherein the first moving mechanism comprises at least one pair of first rails and at least one pair of first guiding seats slidably connected to the at least one pair of first rails.

6. The wafer box conveyer of claim 5, wherein the first moving mechanism comprises a vertical plate and a moving seat, the vertical plate is fixed to the frame for being mounted by the at least one pair of first rails, and the moving seat connects the at least one pair of first guiding seats to allow the moving seat to horizontally move on the frame.

7. A wafer box conveyer comprising:
    a chassis comprising a frame and a plurality of wheels mounted under the frame;
    a first moving mechanism, movably connected to the frame;
    a second moving mechanism, movably connected to the first moving mechanism, wherein a moving direction of the second moving mechanism is perpendicular to that of the first moving mechanism;
    a loading mechanism comprising at least one tray for a wafer box; and
    a shock reduction mechanism disposed between the at least one tray and the frame for absorbing a load of the tray,
    wherein the first moving mechanism comprises at least one pair of first rails and at least one pair of first guiding seats slidably connected to the at least one pair of first rails,
    wherein the first moving mechanism comprises a vertical plate and a moving seat, the vertical plate is fixed to the frame for being mounted by the at least one pair of first rails, and the moving seat connects the at least one pair of first guiding seats to allow the moving seat to horizontally move on the frame, and
    wherein the second moving mechanism comprises a pair of second rails fixed on the moving seat and a second guiding seat slidably connected to the pair of second rails.

8. The wafer box conveyer of claim 7, wherein the second moving mechanism comprises an arm assembly and the arm assembly is fixed on the second guiding seat to move vertically.

9. The wafer box conveyer of claim 8, wherein the arm assembly comprises a connecting rod and a pair of arms separately mounted at two ends of the connecting rod, and the connecting rod is fixed at the second guiding seat.

10. The wafer box conveyer of claim 7, further comprising an elevator, wherein the elevator comprises a rotating rod, a cam, and a passive element, the rotating rod is pivotally connected on the first moving mechanism, the cam is connected to the rotating rod, the cam is formed with an arced trough, two ends of the passive element are fixed to the second guiding seat and a protrusion respectively, and the protrusion is inserted in and confined to the arced trough.

11. The wafer box conveyer of claim 10, wherein the elevator further comprises a pneumatic cylinder and a controller, one end of the pneumatic cylinder is fixed to the moving seat and the other end is connected to the second guiding seat, and the controller is mounted on the rotating rod for controlling the pneumatic cylinder.

12. The wafer box conveyer of claim 10, further comprising a locking mechanism, wherein the locking mechanism comprises a stem, a cord and a stopper, the stem is fixed to the rotating rod, the cord connects the stem and stopper, and the stopper is equipped corresponding to the at least one pair of the first rails for limiting the moving seat.

13. The wafer box conveyer of claim 1, wherein the shock reduction mechanism comprises at least one supporting plate and shock absorbers, the at least one supporting plate is disposed between the frame and the first moving mechanism, and the shock absorbers are fixed on the at least one supporting plate and correspond to the at least one tray.

* * * * *